United States Patent
Lee et al.

(10) Patent No.: US 9,048,460 B2
(45) Date of Patent: Jun. 2, 2015

(54) DEPOSITION APPARATUS AND METHOD FOR MANUFACTURING ORGANIC LIGHT EMITTING DISPLAY APPARATUS BY USING THE SAME

(71) Applicant: Samsung Display Co., Ltd., Yongin, Gyeonggi-do (KR)

(72) Inventors: Tae-Hun Lee, Yongin (KR); Byoung-Seong Jeong, Yongin (KR); Sang-Su Kim, Yongin (KR); Eun-Gook Sung, Yongin (KR); Sung-Hwan Kim, Yongin (KR); Sung-Won Yang, Yongin (KR); Je-Hyun Song, Yongin (KR); Tae-Hyung Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/044,512

(22) Filed: Oct. 2, 2013

(65) Prior Publication Data

US 2014/0326962 A1    Nov. 6, 2014

(30) Foreign Application Priority Data

May 3, 2013  (KR) .................. 10-2013-0050093

(51) Int. Cl.
*H01L 35/24* (2006.01)
*H01L 51/00* (2006.01)
*H01L 51/56* (2006.01)
*C23C 14/24* (2006.01)
(Continued)

(52) U.S. Cl.
CPC ............ *H01L 51/56* (2013.01); *C23C 14/24* (2013.01); *C23C 14/243* (2013.01); *C23C 14/50* (2013.01); *C23C 14/546* (2013.01); *C23C 14/568* (2013.01); *H01L 51/52* (2013.01)

(58) Field of Classification Search
CPC ......................................................... H01L 51/56
USPC .................................. 257/40; 438/14, 15, 34
See application file for complete search history.

(56) References Cited

U.S. PATENT DOCUMENTS

2006/0283382 A1* 12/2006 Yoshikawa et al. ........... 117/200
2012/0118733 A1*  5/2012 Sasaki ...................... 204/298.11

FOREIGN PATENT DOCUMENTS

EP    2543749    1/2013
EP    2688121    1/2014
(Continued)

OTHER PUBLICATIONS

English Abstract for Publication No. 10-2007-0000633.
(Continued)

*Primary Examiner* — Phuc Dang
(74) *Attorney, Agent, or Firm* — F. Chau & Associates, LLC

(57) ABSTRACT

A deposition apparatus is capable of checking, in real time, the thickness or uniformity of a thin layer which is formed. The deposition apparatus includes a moving unit to which a substrate is detachably fixed. A conveyer unit conveys the moving unit in a first direction or in an opposite direction to the first direction. A deposition unit includes at least one deposition assembly for depositing a deposition material on the substrate. A discharge data acquisition unit acquires data associated with the amount of the deposition material discharged per unit time from the at least one deposition assembly. A transmission unit transmits the data acquired by the discharge data acquisition unit.

15 Claims, 8 Drawing Sheets

(51) Int. Cl.
  *C23C 14/50* (2006.01)
  *C23C 14/54* (2006.01)
  *C23C 14/56* (2006.01)
  *H01L 51/52* (2006.01)

(56) References Cited

FOREIGN PATENT DOCUMENTS

| KR | 10-2007-0000633 | 1/2007 |
| KR | 10-2009-0079765 | 7/2009 |
| WO | 2010/027178 | 3/2010 |

OTHER PUBLICATIONS

English Abstract for Publication No. 10-2011-0022512 (for 10-2009-0079765).

European Search Report issued by the European Patent Office on Sep. 12, 2014 in examination of Eurpoean Patent Application No. 14156295.9.

* cited by examiner

DEPOSITION APPARATUS AND METHOD FOR MANUFACTURING ORGANIC LIGHT EMITTING DISPLAY APPARATUS BY USING THE SAME

CROSS-REFERENCE TO RELATED APPLICATIONS

This application claims priority under 35 U.S.C. §119 to and the benefit of Korean Patent Application No. 10-2013-0050093, filed on May 3, 2013, the disclosure of which is incorporated by reference herein in its entirety.

TECHNICAL FIELD

The present inventive concept relates to a deposition apparatus, and more particularly, the present inventive concept relates to a method of manufacturing an organic light-emitting display device by using the deposition apparatus, and an organic light-emitting display device manufactured using the method.

DISCUSSION OF THE RELATED ART

Organic light-emitting display devices may have a larger viewing angle, better contrast characteristics, and a faster response speed than other display devices, and have drawn attention as a next-generation display device. Such organic light-emitting display devices may include intermediate layers (including an emission layer) disposed between a first electrode and a second electrode. The first and second electrodes and the intermediate layers may be formed using various methods, one of which may be an independent deposition method. When an organic light-emitting display device is manufactured using the deposition method, a fine metal mask (FMM), having the same pattern as that of an intermediate layer to be formed and the like, may be disposed to closely contact a substrate on which the intermediate layer and the like are formed, and materials of the intermediate layer and the like may be deposited over the FMM and may form an intermediate layer and the like having desired patterns.

However, in such a deposition method using an FMM, a large FMM needs to be used to manufacture a large organic light-emitting display device by using a large substrate or simultaneously manufacture a plurality of large organic light-emitting display devices by using a large mother-substrate. In this case, the mask may sag due to self-gravity, and thus it may be difficult to form an intermediate layer and the like with a precise or preset pattern. Moreover, the processes of aligning a substrate and an FMM to closely contact each other, performing deposition thereon, and separating the FMM from the substrate are time-consuming, resulting in a long manufacturing time and low production efficiency.

SUMMARY

Aspects of the present inventive concept are directed toward deposition apparatuses capable of checking, in real time, the thickness or uniformity of a thin layer which is formed, methods of manufacturing organic light-emitting display devices by using the deposition apparatuses, and organic light-emitting display devices manufactured using the methods. However, the foregoing are only examples, and the scope of the present inventive concept is not limited thereto.

According to an exemplary embodiment of the present inventive concept, there may be provided a deposition apparatus including a moving unit to which a substrate is detachably fixed. A conveyer unit comprises a first conveyer unit and a second conveyer unit so as to cyclically move the moving unit. The first conveyer unit may convey, in a first direction, the moving unit to which the substrate has been detachably fixed, and the second conveyer unit may convey the moving unit separated from the substrate in a opposite direction to the first direction. A deposition unit that may include a chamber and at least one deposition assembly, the at least one deposition assembly is separated from the substrate by a certain distance and a deposition material is deposited on the substrate while the first conveyer unit is conveying the substrate fixed to the moving unit. A discharge data acquisition unit is disposed on the moving unit and acquires data associated with the amount of the deposition material discharged per unit time from the at least one deposition assembly. A transmission unit is disposed on the moving unit and may transmit the data acquired by the discharge data acquisition unit. The transmission unit may transmit the data wirelessly.

The deposition apparatus may further include a reception unit that receives the data from the transmission unit. The reception unit may be disposed within a chamber.

The deposition apparatus may further include a data conversion unit that converts the data received by the reception unit into data relating to a thickness of a film formed by the deposition.

The deposition assembly may include a deposition source that discharges the deposition material. A deposition source nozzle unit includes a deposition source nozzle and is disposed on a side of the deposition source that faces the first conveyer unit. A patterning slit sheet is disposed opposite to the deposition source nozzle unit and includes a plurality of patterning slits arranged in the first direction.

Data associated with the amount of the deposition material discharged per unit time from the deposition assembly may be acquired in real time.

The discharge data acquisition unit may be disposed on at least one of the edges of the moving unit.

At least two discharge data acquisition units may be included.

According to an exemplary embodiment of the present inventive concept, there is provided a method of manufacturing an organic light-emitting display device. The method may include conveying a moving unit into a chamber when a substrate is fixed to the moving unit, when the conveying is performed by a first conveyer unit. A layer is formed by depositing on a substrate a deposition material discharged from a deposition assembly disposed within the chamber while the substrate is being moved relative to the deposition assembly by the first conveyer unit when the deposition assembly is separated from the substrate by a certain distance. The moving unit is separated from the substrate. The returning is performed by a second conveyer unit provided to pass through the chamber. The forming of the layer may include acquiring data associated with the amount of the deposition material discharged per unit time from the deposition assembly, while the layer is being formed by depositing the deposition material discharged from the deposition assembly on the substrate. The acquiring may be performed by a discharge data acquisition unit. The data acquired by the discharge data acquisition unit may be wirelessly transmitted. The transmitting is performed by the transmission unit. The transmitting may be done wirelessly.

The method may further include receiving the data from the transmission unit. The receiving may be performed by a reception unit. The method may further include converting the data received by the reception unit into data pertaining to a thickness of the layer formed by the deposition.

The deposition assembly may include a deposition source that discharges the deposition material. A deposition source nozzle unit includes a deposition source nozzle and is disposed on a side of the deposition source that faces the first conveyer unit. A patterning slit sheet is disposed opposite to the deposition source nozzle unit and includes a plurality of patterning slits arranged in the first direction.

The discharge data acquisition unit may be attached to one or more of the edges of the moving unit.

Two or more sensors may be included in the discharge data acquisition unit.

According to an exemplary embodiment of the present inventive concept, there may be provided an organic light-emitting display device including a substrate. A plurality of thin film transistors is disposed on the substrate. A plurality of pixel electrodes is electrically connected to the thin film transistor. A plurality of deposition layers is arranged on the plurality of the pixel electrodes. A counter electrode is disposed on the plurality of deposition layers. At least one of the plurality of deposition layers may be a linearly-patterned layer formed using the above-described organic layer deposition apparatus or the above-described methods.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
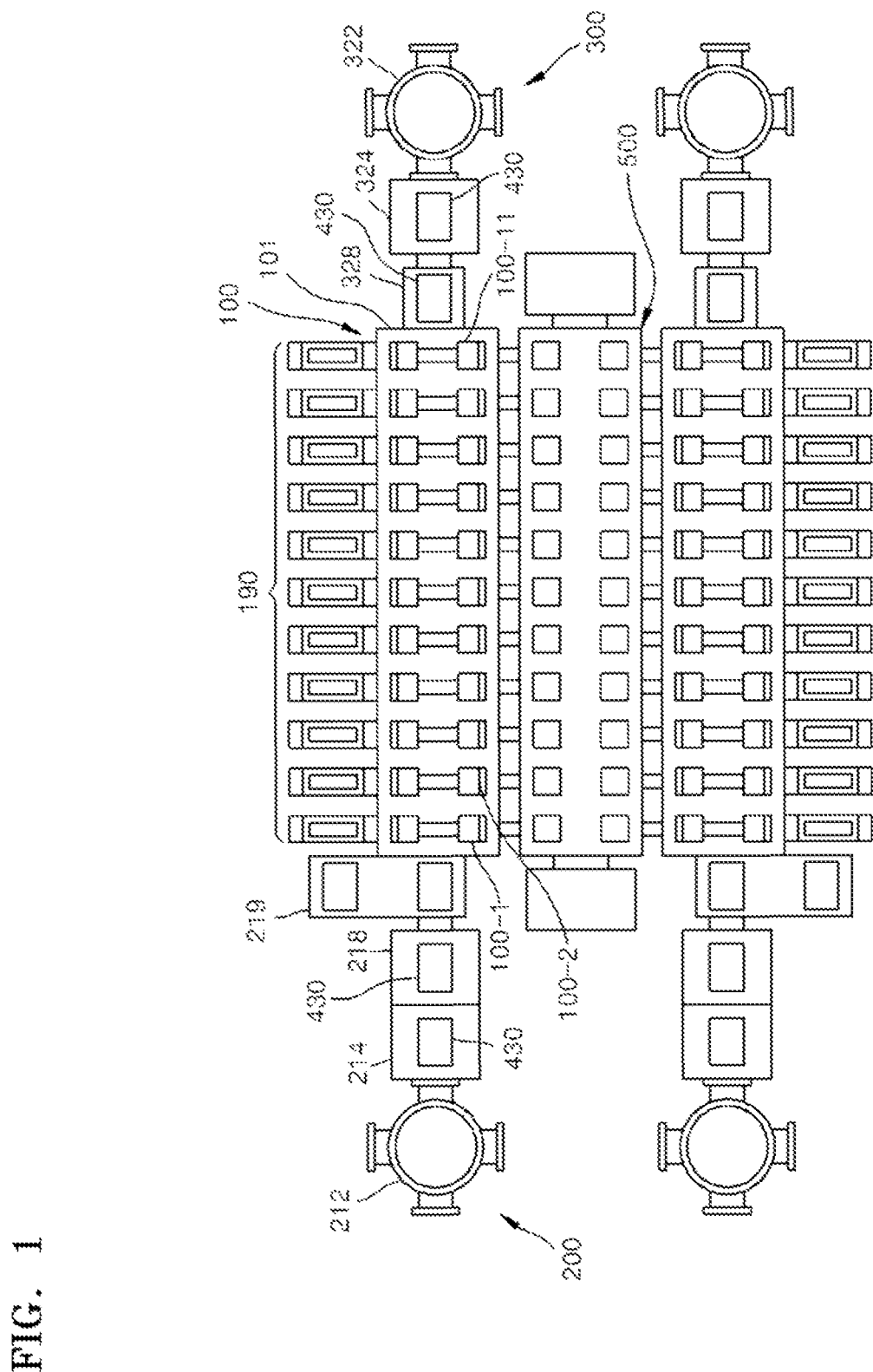
FIG. 1 is a schematic plan view of a deposition apparatus according to exemplary embodiments of the present inventive concept.

Various exemplary embodiments of the present inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the present inventive concept to those skilled in the art. In the drawings, the thicknesses of layers and regions may be exaggerated or minimized for convenience of explanation. The scope of the present inventive concept is not limited to the embodiments shown herein.

In embodiments below, an x-axis, a y-axis, and a z-axis are not limited to the ones in the rectangular coordinate system, and may more broadly be other axes than of the rectangular coordinate system. For example, the x-axis, the y-axis, and the z-axis may cross at right angles to one another, but may point in different directions that are not orthogonal to one another.

Figure 2:
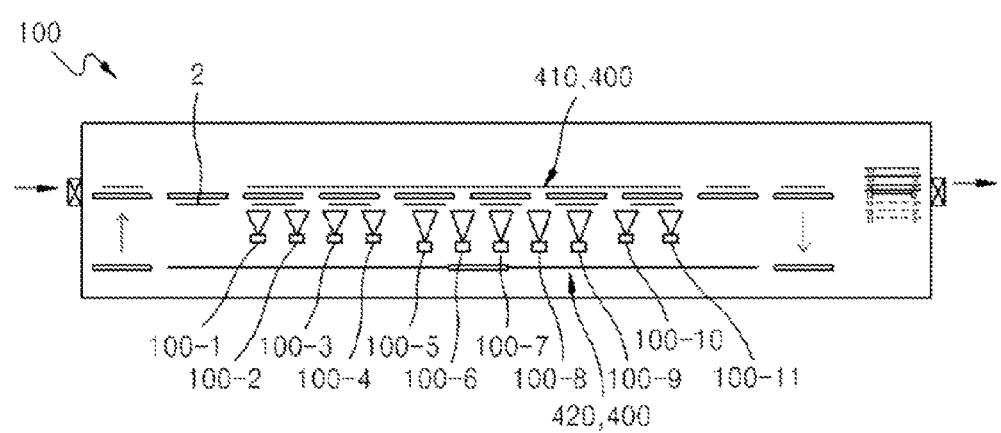
FIG. 2 is a schematic side view of a deposition unit of the deposition apparatus of FIG. 1, according to exemplary embodiments of the present inventive concept.

FIG. 1 is a schematic plan view of a deposition apparatus according to exemplary embodiments of the present inventive concept, and FIG. 2 is a schematic side view of a deposition unit of the deposition apparatus of FIG. 1, according to exemplary embodiments of the present inventive concept.

Figure 5:
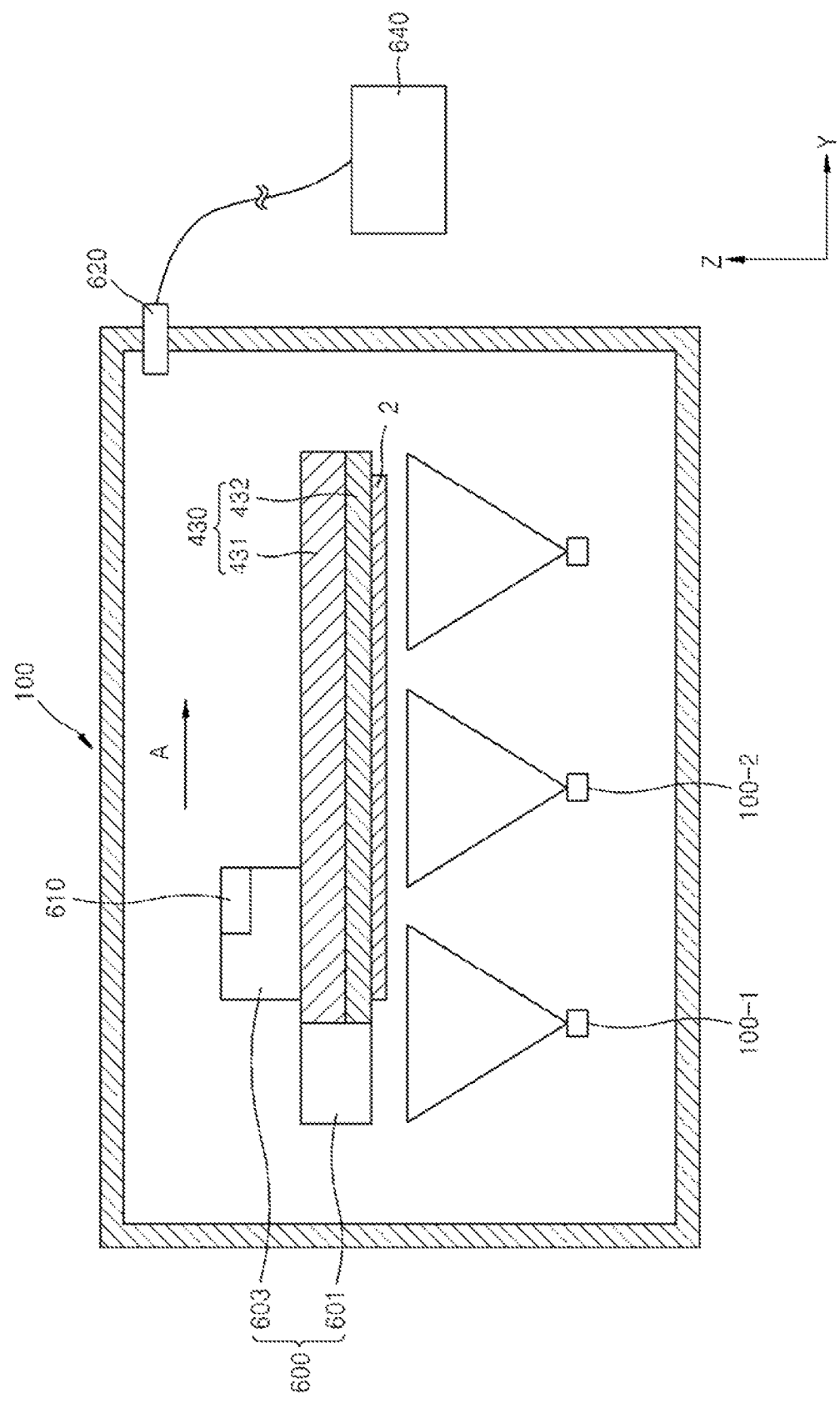
FIG. 5 is a schematic side conceptual view showing a deposition assembly of the deposition unit, a moving unit, and a discharge data acquisition unit included in the deposition apparatus of FIG. 1, according to exemplary embodiments of the present inventive concept.

Referring to FIGS. 1, 2 and 5, the deposition apparatus may include a deposition unit 100, a loading unit 200, an unloading unit 300, a conveyer unit 400, a moving unit 430 to which a substrate 2 (see FIG. 3 or the like) can be detachably fixed, a patterning slit sheet replacement unit 500, a discharge data acquisition unit 600, and/or a transmission unit 610. The conveyer unit 400 may include a first conveyer unit 410, which can convey the moving unit 430, to which the substrate 2 (see FIG. 3 or the like) can be detachably fixed, in a first direction, and a second conveyer unit 420, which can convey the moving unit 430 from which the substrate 2 has been separated in a direction opposite to the first direction.

The loading unit 200 may include a first rack 212, a transport chamber 214, a first inversion chamber 218, and/or a buffer chamber 219.

A plurality of substrates 2 onto which a deposition material has not yet been applied may be stacked up on the first rack 212. A transport robot may be included in the transport chamber 214 and may pick up one of the substrates 2 from the first rack 212, and may dispose the substrate on the moving unit 430 that is transferred by the second conveyer unit 420 and may be positioned within the transport chamber 214. The substrate 2 may be fixed to the moving unit 430 by a clamp or the like. The moving unit 430 to which the substrate 2 may be fixed may be moved into the first inversion chamber 218. Alignment of the substrate 2 with the moving unit 430 may be performed prior to fixing the substrate 2 to the moving unit 430.

In the first inversion chamber 218, a first inversion robot may invert the moving unit 430. The transport robot of the transport chamber 214 may place one of the substrates 2 on a top surface of the moving unit 430, and the moving unit 430 on which the substrate 2 may be disposed may be transferred into the first inversion chamber 218. The first inversion robot of the first inversion chamber 218 may invert the first inversion chamber 218 so that the substrate 2 is turned upside down in the deposition unit 100. In this state, the first conveyer unit 410 may convey the moving unit 430 to which the substrate 2 may be fixed.

The unloading unit 300 may be configured to operate in an opposite manner to the loading unit 200 described above. A second inversion robot in a second inversion chamber 328 may invert the moving unit 430, which may have passed through the deposition unit 100 while the substrate 2 is disposed on the moving unit 430, and then may move the moving unit 430 on which the substrate 2 is disposed into an ejection chamber 324. An ejection robot or the like may separate the substrate 2 from the moving unit 430 in the ejection chamber 324 and may load the substrate 2 into a second rack 322. The moving unit 430, separated from the substrate 2, may be returned to the loading unit 200 via the second conveyer unit 420.

However, the present inventive concept is not limited to the above description. For example, when disposing the substrate 2 on the moving unit 430, the substrate 2 may be fixed onto a lower surface of the moving unit 430 and then moved into the deposition unit 100. For example, the first inversion robot of the first inversion chamber 218 and the second inversion robot of the second inversion chamber 328 need not be required. The first inversion robot of the first inversion chamber 218 and the second inversion robot of the second inversion chamber 328 need not invert the first inversion chamber 218 or the second inversion chamber 328, but may invert only the moving unit 430 to which the substrate 2 has been fixed within the first inversion chamber 218 or the second inversion chamber 328. A conveyer unit in an inversion chamber, capable of conveying the moving unit 430 to which the substrate 2 has been fixed, may rotate 180 degrees with the moving unit 430 positioned above the conveyer unit, and the conveyer unit within the inversion chamber may be understood as serving as the first inversion robot or the second inversion robot. The conveyer unit within the inversion chamber may be a part of the first or second conveyer unit 410 or 420.

As illustrated in FIGS. 1 and 2, the deposition unit 100 may include a chamber 101 in which a plurality of deposition assemblies 100-1, 100-2, through 100-n may be disposed. Referring to FIG. 1, 11 deposition assemblies, e.g., a first deposition assembly 100-1, a second deposition assembly 100-2, through an eleventh deposition assembly 100-11, are disposed in the chamber 101, but the number of deposition assemblies may vary with a desired deposition material and deposition conditions. The chamber 101 may be maintained in a vacuum or in a near-vacuum and may be maintained in a vacuum or a near-vacuum during the deposition process.

The moving unit 430 with the substrate 2 fixed thereon may be moved at least to the deposition unit 100 or may be moved sequentially to the loading unit 200, the deposition unit 100, and the unloading unit 300, by the first conveyer unit 410, and the moving unit 430 that is separated from the substrate 2 in the unloading unit 300 may be moved back to the loading unit 200 by the second conveyer unit 420. The moving unit 430 may be cyclically moved by the first and second conveyer units 410 and 420.

The first conveyer unit 410 may be disposed to pass through the chamber 101 when passing through the deposition unit 100, and the second conveyer unit 420 may be disposed to convey the moving unit 430 from which the substrate 2 is separated.

In exemplary embodiments of the present inventive concept, the deposition apparatus may be configured such that the first conveyer unit 410 and the second conveyer unit 420 may be respectively disposed above and below, so that after the moving unit 430, on which deposition has been completed while passing through the first conveyer unit 410, is separated from the substrate 2 in the unloading unit 300, the moving unit 430 may be returned to the loading unit 200 via the second conveyer unit 420 formed below the first conveyer unit 410. The second conveyer unit 420 may be located above the first conveyer unit 410.

As illustrated in FIG. 1, the deposition unit 100 may include one or more deposition source replacement units 190. The one or more deposition source replacement units may be disposed at a side of each deposition assembly. The one or more deposition source replacement units 190 may be formed as a cassette-type that may be drawn to the outside of each organic layer deposition assembly. Thus, a deposition source 110 (e.g. FIG. 3) of a deposition assembly (e.g. 100-1) may be easily replaced.

FIGS. 1 and 2 illustrate an exemplary embodiment of the present inventive concept in which two sets of structures, which may comprise the loading unit 200, the deposition unit 100, the unloading unit 300, and the conveyer unit 400 may be arranged in parallel. In an exemplary embodiment of the present inventive concept, a patterning slit sheet replacement unit 500 may be disposed between the two deposition apparatuses.

Figure 3:
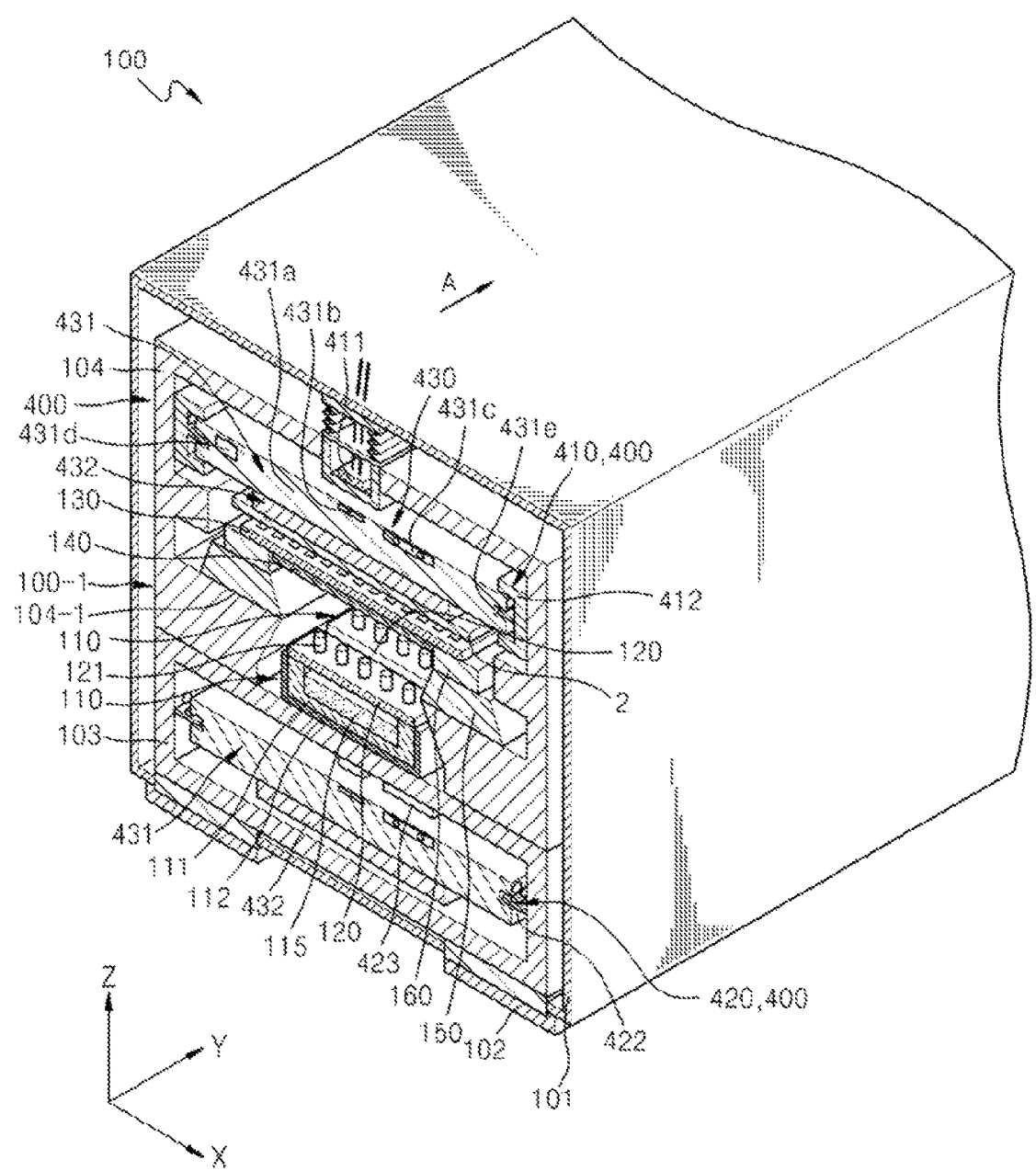
FIG. 3 is a schematic perspective cross-sectional view of a part of the deposition unit of the deposition apparatus of FIG. 1, according to exemplary embodiments of the present inventive concept.
Figure 4:
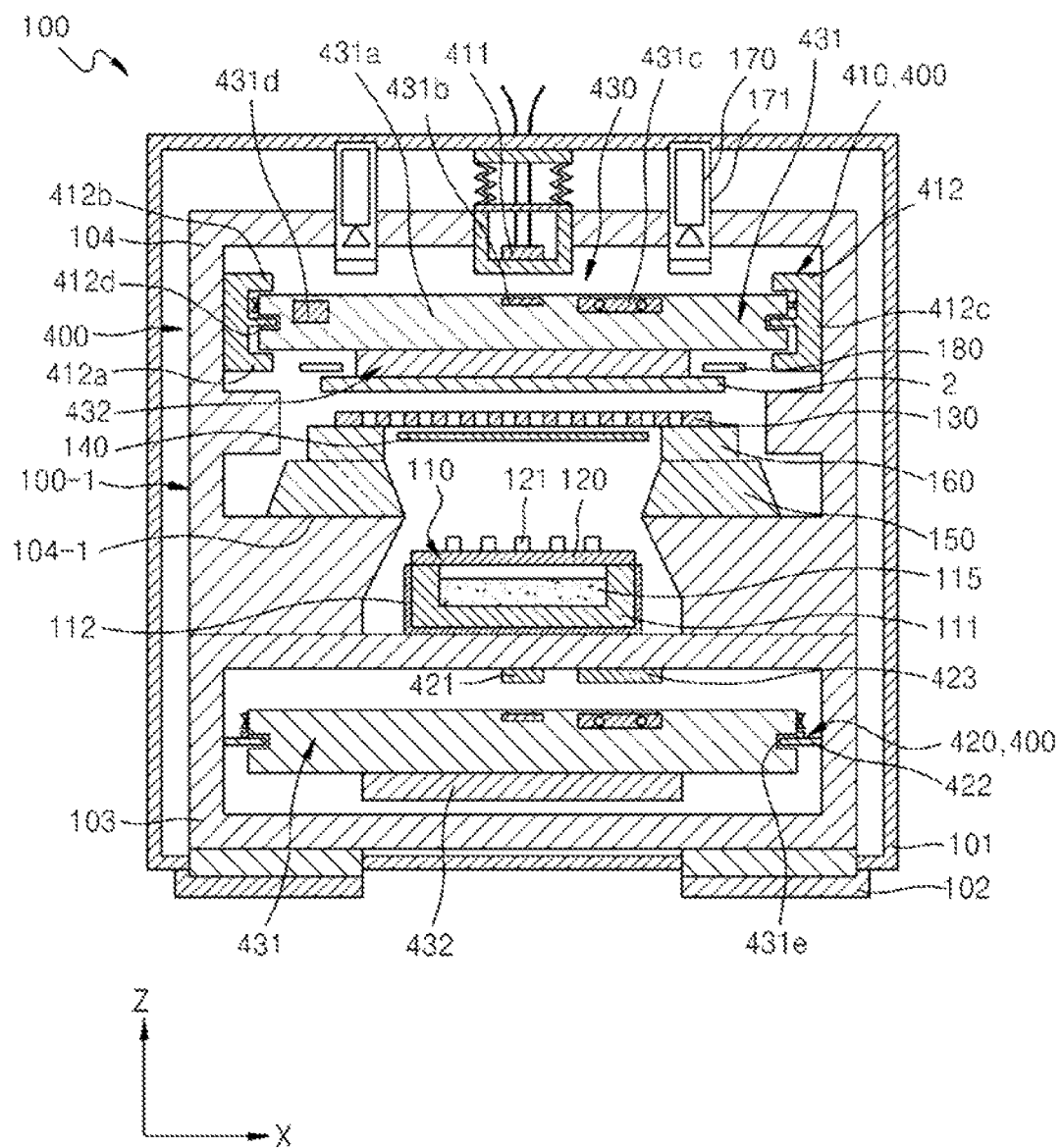
FIG. 4 is a schematic cross-sectional view of the part of the deposition unit of FIG. 3, according to exemplary embodiments of the present inventive concept.

FIG. 3 is a schematic perspective cross-sectional view of a part of the deposition unit 100 of the deposition apparatus of FIG. 1, according to exemplary embodiments of the present inventive concept. FIG. 4 is a schematic cross-sectional view of a part of the deposition unit 100 of FIG. 3, according to exemplary embodiments of the present inventive concept. Referring to FIGS. 3 and 4, the deposition unit 100 of the deposition apparatus according to exemplary embodiments of the present inventive concept may include at least one deposition assembly 100-1 and a chamber 101.

The chamber 101 may be formed as a hollow box type and accommodate the at least one organic layer deposition assembly (e.g. 100-1). As illustrated in FIGS. 3 and 4, the conveyer unit 400 may also be accommodated within the chamber 101. The moving unit 400 may lie from the inside to the outside of the chamber 101.

The chamber 101 may accommodate a lower housing 103 and an upper housing 104. A foot 102 may be formed and may fix the deposition unit 100 on the ground, the lower housing 103 may be disposed on the foot 102, and the upper housing 104 may be disposed on the lower housing 103. In this regard, a connection part of the lower housing 103 and the chamber 101 may be sealed so that the inside of the chamber 101 is completely isolated from the outside. The lower housing 103 and the upper housing 104 may be maintained in a fixed position even while the chamber 101 is repeatedly contracted and expanded. The lower housing 103 and the upper housing 104 may serve as a reference frame in the deposition unit 100.

The upper housing 104 may comprise the deposition assembly 100-1 and the first conveyer unit 410 of the conveyer unit 400, and the lower housing 103 may comprise the second conveyer unit 420 of the conveyer unit 400. While the moving unit 430 is cyclically moving between the first conveyer unit 410 and the second conveyer unit 420, a deposition process may continuously be performed on the substrate 2. The substrate 2 may be fixed onto the moving unit 430. The moving unit 430 may include a carrier 431 and an electrostatic chuck 432 attached to the carrier 431.

The carrier 431 may include a main body part 431a, a linear motor system (LMS) magnet 431b, contactless power supply (CPS) modules 431c, a power supply unit 431d, and guide grooves 431e. In exemplary embodiments of the present inventive concept, the carrier 431 may further include cam followers.

The main body part 431a may constitute a base part of the carrier 431 and may be formed of a magnetic material such as iron. The carrier 431 may be maintained spaced apart from guide members 412 of the first conveyer unit 410 by a certain distance. The guide grooves 431e may be respectively formed at both sides of the main body part 431a. The guide grooves 431e may accommodate guide protrusions 412d of the guide members 412 of the first conveyer unit 410 or roller guides 422 of the second conveyer unit 420.

The LMS magnet 431b may be formed along a center line of the main body part 431a in a direction where the main body part 431a proceeds (e.g., a Y-axis direction). The LMS magnet 431b and a coil 411 may be combined to constitute a linear motor, and the carrier 431 and the moving unit 430 may be conveyed in an arrow A direction. The carrier 431 and the moving unit 430 may be conveyed by the linear motor. The moving unit 430 may also be moved by a current applied to the coil 411 of the first conveyer unit 410. A plurality of coils 411 may be arranged at regular intervals within the chamber 101, for example, in a Y-axis direction. The coil 411 may be provided in an air atmosphere and may be disposed in an atmosphere (ATM) box.

The CPS modules 431c and the power supply unit 431d may be respectively formed on both sides of the LMS magnet 431b in the main body part 431a. The power supply unit 431d may include a rechargeable battery. The rechargeable battery may provide power so that the electrostatic chuck 432 can chuck the substrate 2 and maintain the chucking operation. The CPS modules 431c may be wireless charging modules that charge the rechargeable battery of the power supply unit 431d. A charging track 423 formed in the second conveyer unit 420 may be connected to an inverter (not shown). When the carrier 431 is transferred by the second conveyer unit 420, a magnetic field may be formed between the charging track 423 and the CPS modules 431c and may supply power to the CPS module 431c. The power supplied to the CPS modules 431c may be used to charge the power supply unit 431d.

The electrostatic chuck 432 may include a main body. The main body may be formed of ceramic and an electrode that is embedded in the main body and is supplied with power. The substrate 2 may be attached onto a surface of the main body of the electrostatic chuck 432 as a high voltage is applied from the power supply unit 431d of the main body part 431a of the carrier 431 to the electrode embedded in the main body of the electrostatic chuck 432.

The first conveyer unit 410 may convey the moving unit 430 in a first direction (e.g. a+Y direction). The substrate 2 may be affixed to the moving unit 430. The first conveyer unit 410 may include the coil 411 and the guide members 412, which have been described above, and may further include magnetically suspended bearings or gap sensors.

The coil 411 and the guide members 412 may be formed on inner surfaces of the upper housing 104. For example, the coil 411 may be formed on an upper inner surface of the upper housing 104, and the guide members 421 may be respectively formed on both inner side surfaces of the upper housing 104.

The coil 411 may constitute a linear motor together with the LMS magnet 431b of the main body part 431a of the moving unit 430 as described above. The linear motor may move the moving unit 430. The guide members 412 may guide the moving unit 430 to move in the first direction (e.g. a+Y direction). The guide members 412 may be formed to pass through the deposition unit 100.

The guide members 412 may accommodate both sides of the carrier 431 of the moving unit 430. The guide members may guide the carrier 431 to move along in the arrow A direction illustrated in FIG. 3. Each guide member 412 may include a first accommodation part 412a disposed below the carrier 431, a second accommodation part 412b disposed above the carrier 431, and a connection part 412c that connects the first accommodation part 412a and the second accommodation part 412b. An accommodation groove may be formed by the first accommodation part 412a, the second accommodation part 412b, and the connection part 412c, and a guide protrusion 412d may be accommodated within the accommodation groove.

Magnetically suspended bearings (not shown) may be disposed in the connection part 412c of the guide member 412 and may respectively correspond to both sides of the carrier 431. The magnetically suspended bearings may cause a distance between the carrier 431 and the guide member 412 so that the carrier 431 is moved along the guide members 412 without contacting the guide members 412. Each magnetically suspended bearing may be disposed in the second accommodation part 412b above the carrier 431. The magnetically suspended bearings may enable the carrier 431 to be moved along the guide members 412 without contacting the first and second accommodation parts 412a and 412b with a constant distance maintained between first and second accommodation parts 412a and 412b. To ensure a constant distance between the carrier 431 and the respective guide members 412, each guide member 412 may further include a gap sensor (not shown) disposed in the first accommodation part 412a and/or the connection part 412c and may correspond to a bottom portion of the carrier 431. Magnetic forces of the magnetically suspended bearings may vary according to values measured by the gap sensors and distances between the carrier 431 and the respective guide members 412 may be adjusted in real time. A precise transfer of the carrier 431 may be feedback controlled using the magnetically suspended bearings and the gap sensors.

The second conveyer unit 420 may return the moving unit 430 from which the substrate 2 has been separated in the unloading unit 300 after deposition is completed in the deposition unit 100, to the loading unit 200. The second conveyer unit 420 may include the coil 421, the roller guides 422, and the charging track 423, which may be disposed in the lower housing 103. For example, the coil 421 and the charging track 423 may be disposed on a top inner surface of the lower housing 103, and the roller guides 422 may be disposed on both lateral inner surfaces of the lower housing 103. The coil 421 may be disposed in an ATM box, as the coil 411 of the first conveyer unit 410.

Like the coil 411, the coil 421 may constitute a linear motor together with the LMS magnet 431b of the carrier 431 of the moving unit 430. The moving unit 430 may be moved by the linear motor in a direction (e.g., a −Y direction) opposite to the first direction (e.g., a +Y direction).

The roller guides 422 may guide the carrier 431 to move in the direction opposite to the first direction. In this regard, the roller guides 422 may be formed to pass through the deposition unit 100. The roller guides 422 may support cam followers (not shown) respectively formed on both sides of the carrier 431 of the moving unit 430 to guide the moving unit 430 to move along the direction (−Y direction) opposite to the first direction (+Y direction).

The second conveyer unit 420 may be used in a process of returning the moving unit 430 from which the substrate 2 has been separated and not in a process of depositing an organic material on the substrate 2, and position accuracy of the moving unit 430 may not be needed with regard to conveyer unit 410. Magnetic suspension may be applied to the first conveyer unit 410 that may require high position accuracy of the moving unit 430 being moved, and a conventional roller method may be applied to the second conveyer unit 420 that may require relatively low position accuracy. The magnetic suspension may also be applied to the second conveyer unit 420 as in the first conveyer unit 410.

While the first conveyer unit 410 is conveying the substrate 2 fixed to the moving unit 430 in the first direction (+Y direction), the deposition assembly 100-1 may deposit a deposition material 115 on the substrate from a certain distance and the certain distance may be kept constant. The structure of the deposition assembly 100-1 will now be described in detail.

Each deposition assembly (e.g. deposition assembly 100-1) may include a deposition source 110, a deposition source nozzle unit 120, a patterning slit sheet 130, a shielding member 140, a first stage 150, a second stage 160, a camera 170, and a sensor 180. All the components of the deposition unit 100 illustrated in FIGS. 3 and 4 may be disposed within the chamber 101 that may be maintained at an appropriate degree of vacuum.

The deposition source 110 may discharge the deposition material 115. Although two deposition sources 110 are illustrated in FIG. 3, the number of deposition sources 110 included in each deposition assembly is not limited to two, and one deposition source 110 or a plurality of deposition sources 110 may be included in each deposition assembly. The deposition source 110 may be disposed in a lower portion of a deposition assembly (e.g. deposition assembly 100-1). The deposition material 115 accommodated in the deposition source 110 may be sublimated or vaporized and directed toward the substrate 2 (for example, upward, in a+Z direction). The deposition source 110 may include a crucible 112 that is filled with the deposition material 115, and a heater 112 that heats the crucible 111 to vaporize the deposition material 115. The heater 112 may be contained in the crucible 112.

The deposition source nozzle unit 120 may include a plurality of deposition source nozzles 121 formed thereon and may be disposed at a side of the deposition source 110 facing the substrate 2.

The patterning slit sheet 130 may be disposed opposite to the deposition source nozzle unit 120 and may include a plurality of patterning slits arranged in a first direction (e.g. the X-axis direction). The patterning slit sheet 130 may be positioned between the deposition source 110 and the substrate 2. The deposition material 115 that is vaporized in the deposition source 110, may pass through the deposition source nozzle unit 120 and the patterning slit sheet 130 and may be deposited on the substrate 2, which constitutes a target on which the deposition material 115 may be deposited. The patterning slit sheet 130 may have an aperture extending along the X axis.

The patterning slit sheet 130 may be manufactured by etching used in a conventional method of manufacturing a fine metal film (FMM), and in particular, a striped FMM. The patterning slit sheet 130 may be disposed to be a certain distance apart from the deposition source 110 (and the deposition source nozzle unit 120 coupled with the deposition source 110) and the distance may be kept constant.

The chamber 101 may be maintained in a high-vacuum state that is the same as or similar to that in a deposition method using an FMM. In addition, the temperature of the patterning slit sheet 130 may be sufficiently lower than the temperature of the deposition source 110. For example, the temperature of the patterning slit sheet 130 may be about 100 degrees Celsius or less. The temperature of the patterning slit sheet 130 may be sufficiently low so as to reduce thermal expansion of the patterning slit sheet 130. In an embodiment, when the temperature of the patterning slit sheet 130 increases, the sizes, locations, or the like of the patterning slits of the patterning slit sheet 130 may be deformed due to thermal expansion, and the patterning slit sheet 130 may be formed in a pattern different from a preset pattern on the substrate 2.

The substrate 2 may be disposed in the chamber 101. The substrate 2 may be a substrate for flat panel displays. A large substrate, such as a mother glass, for manufacturing a plurality of flat panel displays, may be used as the substrate 2.

In the deposition apparatus according to exemplary embodiments of the present inventive concept, deposition may be performed while the deposition assembly 100-1 or the substrate 2 is moved relative to the other. For example, while the first conveyer unit 410 is conveying the substrate 2 fixed to the moving unit 430 in the first direction (+Y direction), the deposition assembly 100-1 spaced apart from the substrate 2 by a constant distance may deposit the deposition material 115 on the substrate 2. Deposition may be performed in a raster scanning manner while the substrate 2, which may be opposite to a deposition assembly (e.g. deposition assembly 100-1), is moved in a direction of arrow A in FIG. 3. Although deposition may be performed while the substrate 2 is being moved in the +Y direction within the chamber 101 in FIG. 3, the present inventive concept is not limited thereto. For example, deposition may be performed while a deposition assembly (e.g. deposition assembly 100-1) is moved in the −Y direction and the substrate 2 is held in a fixed position.

In a deposition apparatus according to exemplary embodiments of the present inventive concept, the patterning slit sheet 130 may be much smaller than an FMM used in a conventional deposition method. In a deposition apparatus according to a present embodiment, deposition may be continuously performed (e.g. in a raster scanning manner, while the substrate 2 is moved in the Y-axis direction ⌐. Although the length of the patterning slit sheet 130 in the Y-axis direction may be significantly less than the length of the substrate 2 in the Y-axis direction, deposition can be sufficiently performed on almost the entire surface of the substrate 2.

As illustrated in FIGS. 3 and 4, the upper housing 104 may include accommodation portions 104-1, which may be respectively formed on both sides of the deposition source 100, and the deposition source nozzle unit 120 and may have a protruding shape. The first stage 150, the second stage 160, and the patterning slit sheet 130 may be sequentially formed on the accommodation portions 104-1.

The first stage 150 may align the patterning slit sheet 130 in the X-axis and Y-axis directions. The first stage 150 may include a plurality of actuators in order to move the patterning slit sheet 130 relative to the upper housing 104 in the X-axis and Y-axis directions. The second stage 160 may align the patterning slit sheet 130 in the Z-axis direction. The second stage 160 may include a plurality of actuators in order to move the patterning slit sheet 130 relative to the first stage 150 in the Z-axis direction.

The patterning slit sheet 130 may be aligned with the substrate 2 via the first stage 150 and the second stage 160 as described above. Real time alignment, between the substrate 2 and the patterning slit sheet 130 may be performed.

The upper housing 104, the first stage 150, and the second stage 160 may guide a flow path of the deposition material 115 such that the deposition material 115 discharged through the deposition source nozzles 121 is not dispersed outside the flow path. The flow path of the deposition material 115 may be defined by the upper housing 104, the first stage 150, and the second stage 160, and the movement of the deposition material 115 in the X-axis direction may be suppressed.

A deposition assembly (e.g. 100-1) may further include a camera 170 and a sensor 180. The camera 170 and the sensor 180 may be used in an alignment of the patterning slit sheet 130 and the substrate 2. The sensor 180 may be a confocal sensor. The camera 170 may check in real time a first alignment mark (not shown) formed in the patterning slit sheet 130 and a second alignment mark (not shown) formed on the substrate 2. The first and second alignment marks may be used to produce data that is used for the patterning slit sheet 130 and the substrate 2 to be accurately aligned on an XY plane. The sensor 180 may produce data about distances between the patterning slit sheet 130 and the substrate 2 and the data may be used to maintain a suitable distance between the patterning slit sheet 130 and the substrate 2.

A distance between the substrate 2 and the patterning slit sheet 130 can be measured in real time using the camera 170 and the sensor 180. The substrate 2 can be aligned with the patterning slit sheet 130 in real time.

The shielding member 140 may be disposed between the patterning slit sheet 130 and the deposition source 110. The shielding member 140 may prevent the deposition material 115 from being deposited on a non-film-forming region of the substrate 2. The shielding member 140 may include two adjacent plates (not shown). The non-film-forming region of the substrate 2 may be screened by the shielding member 140, and the deposition material 115 may be effectively prevented from being deposited on the non-film-forming region of the substrate 2, without using a separate structure.

The discharge data acquisition unit 600 and the transmission unit 610 may be included in the deposition apparatus. The deposition apparatus according to exemplary embodiments of the present inventive concept will now be described in detail with reference to FIG. 5.

FIG. 5 is a schematic side conceptual view illustrating, for example, the deposition assembly 100-1 of the deposition unit 100, the moving unit 430, and the discharge data acquisition unit 600, which are included in the deposition apparatus of FIG. 1, according to exemplary embodiments of the present inventive concept. As illustrated in FIG. 5, the discharge data acquisition unit 600 may be disposed on the moving unit 430. The discharge data acquisition unit 600 may include, for example, a sensor 601 and an oscillator 603. The transmission unit 610 may also be disposed on the moving unit 430, and, on the oscillator 603. The sensor 601 of the discharge data acquisition unit 600 may be disposed on an edge of the moving unit 430 facing the direction (e.g. −Y direction) opposite to the first direction (e.g. +Y direction) in which the moving unit 430 is moved, from among the edges of the moving unit 430. The sensor 601 may be a crystal sensor. However, the present inventive concept is not limited thereto.

As illustrated in FIG. 5, the sensor 601 of the discharge data acquisition unit 600 may be attached to an edge of the moving unit 430. The oscillator 603 of the discharge data acquisition unit 600 may be attached onto the carrier 431 of the moving unit 430. The sensor 601 may be attached to one of the carrier 431 and the electrostatic chuck 432, which may be included in the moving unit 430.

The discharge data acquisition unit 600 may acquire data associated with the amount of the deposition material 115 discharged from the deposition assembly 100-1 per unit time A thickness of the deposition material 115 that is discharged from the deposition source 110 and deposited on the substrate 2 fixed to the moving unit 430 may be measured using the discharge data acquisition unit 600.

When the discharge data acquisition unit 600 acquires the data associated with the amount of the deposition material 115 discharged from the deposition assembly 100-1 per unit time, the transmission unit 610 may transmit the data, and the reception unit 620 may receive the data. The data may be transmitted wirelessly. The reception unit 620 may be attached to the chamber 101 by penetrating through the outer wall of the chamber 101. The reception unit 620 may receive the transmitted data within the chamber 101. The reception unit 620 may be connected to a data conversion unit 640 located outside the chamber 101 and may convert the data about the amount of the deposition material 115 discharged from the deposition assembly 100-1 per unit time into data about the thickness of the deposition material 115 deposited on the substrate 2.

The discharge data acquisition unit 600 may acquire the data associated with the amount of the deposition material 115 discharged from a deposition assembly (e.g. deposition assembly 100-1) per unit time, according to various methods. For example, when a deposition assembly discharges the deposition material 115, the deposition material 115 may be detected by the sensor 601 attached to the moving unit 430. The frequency of the sensor 601 may vary according to the amount of the deposition material 115 deposited on the substrate 2 per unit time. Therefore, the data about the amount of the deposition material 115 discharged from a deposition assembly per unit time may be the frequency of the sensor 601 that may vary according to the amount of the deposition material 115 discharged per unit time.

The oscillator 603 may measure the frequency of the sensor 601. The oscillator 603 may be attached to the moving unit 430. The frequency of the sensor 601 measured by the oscillator 603 may be converted into digital data via an analog-to-digital (A/D) converter, and the digital data may be transmitted to the transmission unit 610. The transmission unit 610 may transmit the digital data about the frequency to the reception unit 620, and the transmission may be done wirelessly. The reception unit 620 may transmit the digital data to the data conversion unit 640, and the data conversion unit 640 may convert the digital data into analog data by using a digital-to-analog (D/A) converter or the like. The data conversion unit 640 may convert the data about the frequency of the sensor 601 into data about the thickness of a thin film formed by depositing the deposition material 115 on the substrate 2 per unit time.

The thickness of the thin film may be measured within the chamber 101 in real time and may be monitored in real time outside the chamber 101.

In the deposition apparatus according to exemplary embodiments of the present inventive concept, when the deposition material 115 is deposited on the substrate 2, the amount of the deposition material 115 discharged from the deposition assembly 100-1 per unit time can be measured within the chamber 101, and the thickness of a thin film formed on the substrate 2 can be measured without needing to interrupt the manufacturing of an organic light-emitting display device.

Figure 7:
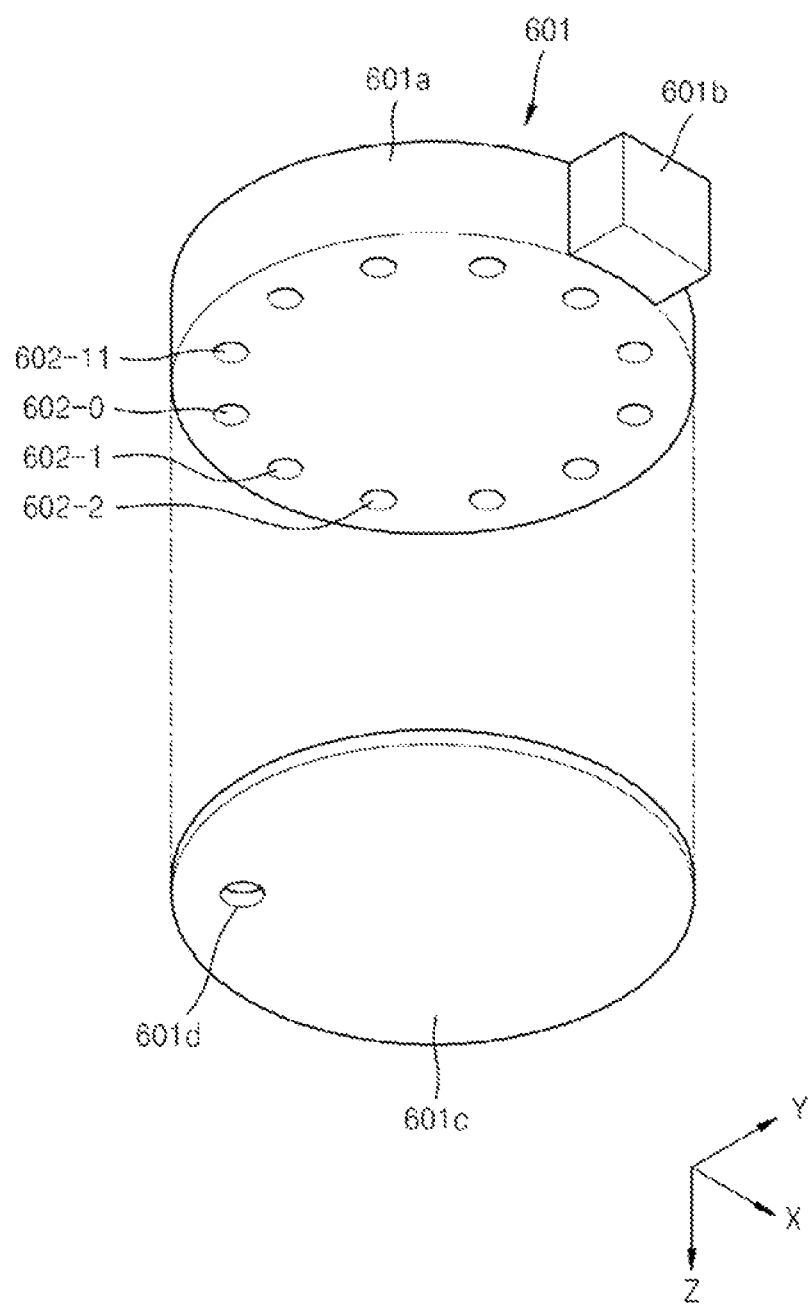
FIG. 7 is a schematic exploded perspective view of a sensor of a discharge data acquisition unit according to exemplary embodiments of the present inventive concept.

In the deposition apparatus according to exemplary embodiments of the present inventive concept, the sensor 601 may include a plurality of sensing units 602-1 through 602-11 (see, e.g., FIG. 7). In the deposition apparatus according to exemplary embodiments of the present inventive concept, a plurality of test substrates may not be needed even when a plurality of deposition sources are disposed in a single deposition apparatus. In the deposition apparatus according to exemplary embodiments of the present inventive concept, data relating to the thickness of a thin film formed on the substrate 2 by a deposition assembly (e.g. deposition assembly 100-1), can be obtained while an organic light-emitting display device is being manufactured by forming a thin film on the substrate 2.

In addition to the data conversion unit 640, a data comparison unit (not shown) may be further included. The data obtained by the data conversion unit 640 or data produced during the conversion by the data conversion unit 640 may be fed back to the data comparison unit, and then the data comparison unit may compare the fed-back data with previous data to determine whether the fed-back data is equal to the previous data.

Figure 6:
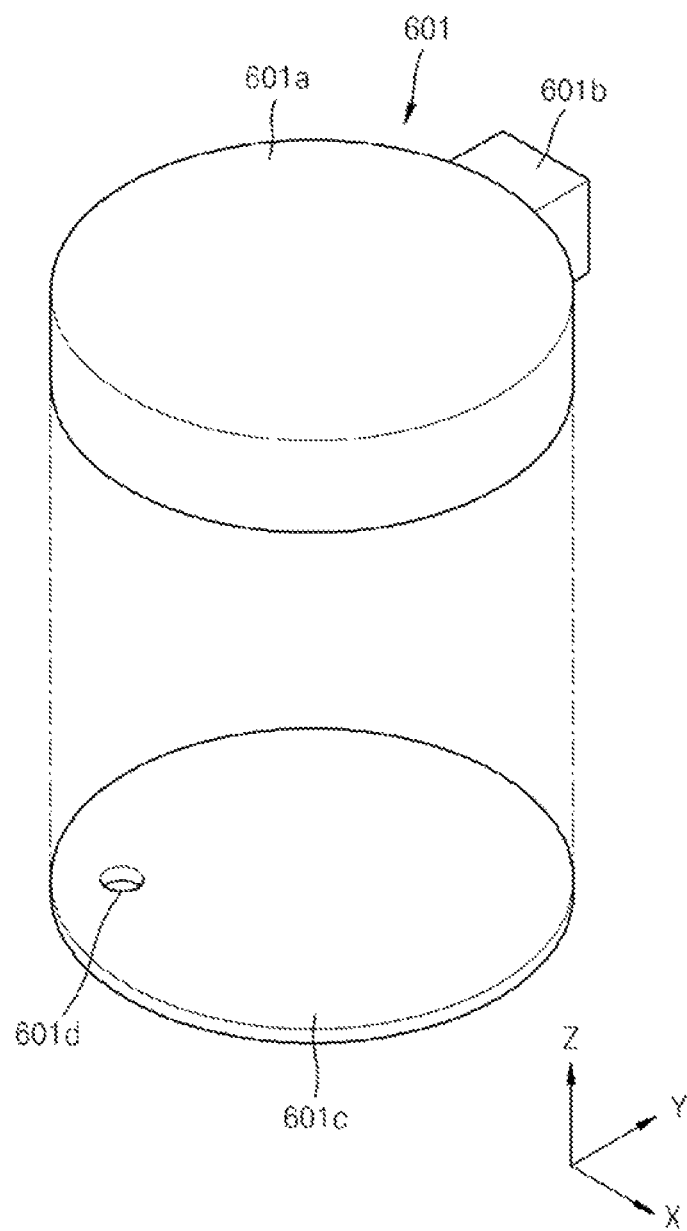
FIG. 6 is a schematic exploded perspective view of a sensor of a discharge data acquisition unit according exemplary embodiments of the present inventive concept.

FIGS. 6 and 7 are schematic exploded perspective views of the sensor 601 of the discharge data acquisition unit 600.

Referring to FIGS. 6 and 7, the sensor 601 may include a frequency acquisition unit 601a, a connection unit 601b and a cover plate 601c. The connection unit 601b may connect the frequency acquisition unit 601a to the moving unit 430. The cover plate 601c may have a sensing hole 601d. The sensing hole 601d may be an aperture formed off-center. As illustrated in FIG. 7, 11 sensing units, namely, first through eleventh sensing units 602-1 through 602-11, may be disposed on a bottom surface of the frequency acquisition unit 601a of the sensor 601. The number of sensing units included in the sensor 601 may vary. The number of sensing units may vary according to the number of deposition assemblies and a deposition material. For example, 11 deposition assemblies 100-1 through 100-11 (see, e.g., FIG. 1) may be matched with the 11 sensing units 602-1 through 602-11 in a one-to-one correspondence, so that each sensing unit, for example, the sensing unit 602-1, may measure the amount of the deposition material 115 discharged from a corresponding deposition assembly, for example, the deposition assembly 100-1, per unit time.

The deposition material 115 discharged from a single deposition assembly (e.g. deposition assembly 100-1) or the deposition material 115 discharged from a deposition source 110 of the single deposition assembly may reach the first through eleventh sensing units 602-1 through 602-11. The deposition material 115 may reach a sensing unit (e.g. sensing unit 602-1) via sensing hole 601d. The cover plate 601c may shield the other sensing units (e.g. 602-2 through 602-11) to prevent the deposition material 115 from reaching the other sensing units (e.g. 602-2 through 602-11). The amounts of the deposition material 115 respectively discharged from a plurality of deposition assemblies or a plurality of deposition sources per unit time may be measured using the single sensor 601.

The first through eleventh sensing units 602-1 through 602-11 may be formed on the frequency acquisition unit 601a. For example, as illustrated in FIG. 7, a dummy sensing unit 602-0 may be included in addition to the other sensing units (e.g. 602-1 through 602-11).

A single sensor 601 may recognize the amounts of the deposition material 115 respectively discharged per unit time from a plurality of deposition assemblies or a plurality of deposition sources. While the sensor 601 is passing between a first and a second deposition assemblies (e.g. 100-1 and 100-2), the deposition material 115 discharged from the first deposition assembly and the deposition material 115 discharged from the second deposition assembly may be mixed and reach the sensor 601. The dummy sensing unit 602-0 may be made exposed while the sensor 601 is passing through between the first and second deposition assemblies, and a sensing unit corresponding to a deposition assembly involved in a measurement of a discharged deposition material amount may be made exposed while the sensor 601 is passing over the deposition assembly involved in the measurement.

Figure 8:
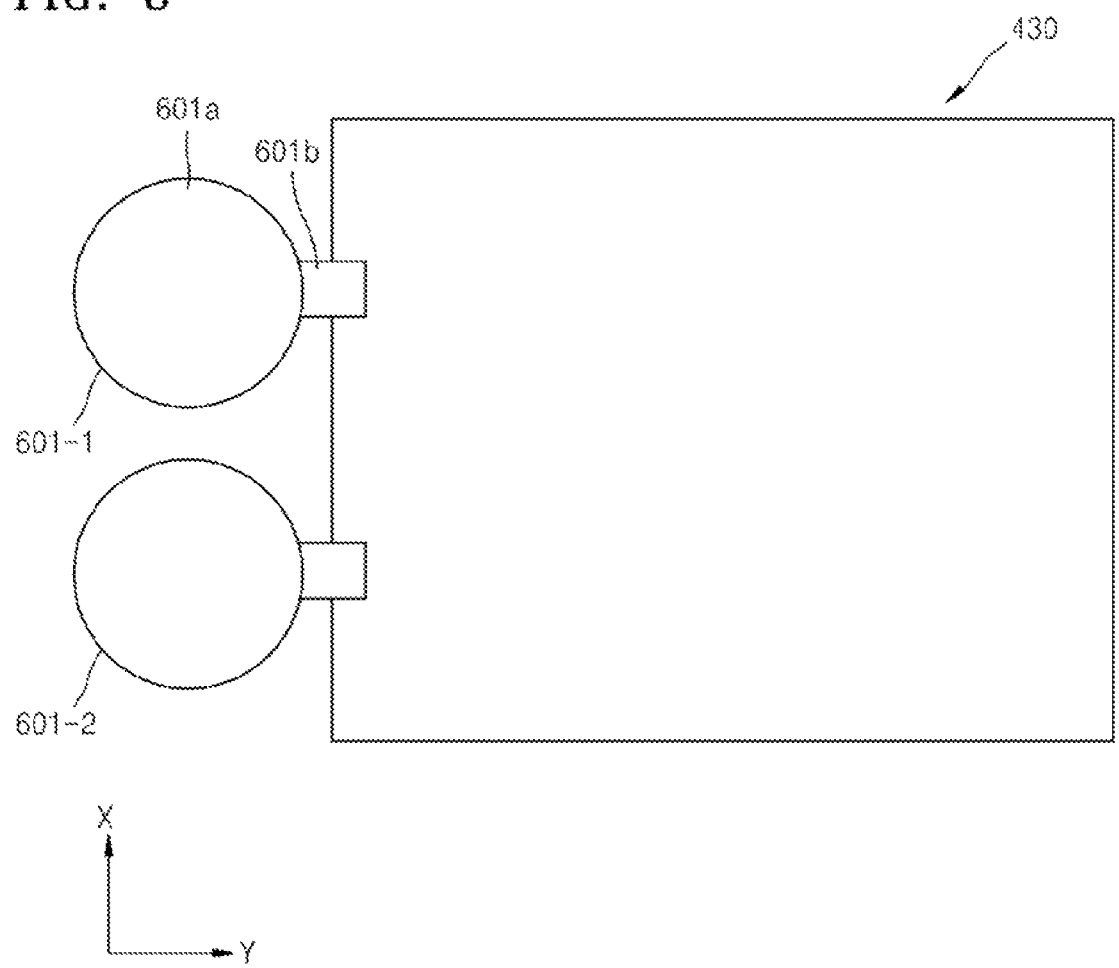
FIG. 8 is a schematic plan view of a moving unit and a part of a discharge data acquisition unit according to exemplary embodiments of the present inventive concept.

FIG. 8 is a schematic plan view of the moving unit 430 and a part of the discharge data acquisition unit 600. As illustrated in FIG. 8, the sensor 601 may be disposed on an edge of the moving unit 430 facing the direction (e.g. −Y direction) opposite to the first direction (e.g. +Y direction) in which the moving unit 430 is moved, from among the edges of the moving unit 430. A plurality of sensors 601-1 through 601-n may be disposed on the moving unit 430. The sensor 601 may be disposed on the carrier 431 or the electrostatic chuck 432.

A first sensor 601-1 and a second sensor 601-2 may be disposed at different positions as illustrated in FIG. 8. The first and second sensors may individually measure the thickness of the thin film at different locations on the substrate 2. The thickness of the thin film may be monitored and the accuracy of the measurement may be increased by using an average of the two measured thickness values.

The locations of the sensors 601-1 through 601-n are not limited thereto. The sensors 601-1 through 601-n may be disposed on any of the four edges of the moving unit 430.

Although a deposition apparatus has been described above, the present inventive concept is not limited thereto. A method of manufacturing an organic light-emitting display device by using such a deposition apparatus also belongs to the scope of the present inventive concept.

In an exemplary method of manufacturing an organic light-emitting display device, according to exemplary embodiment of the present inventive concept, a moving unit 430 to which a substrate 2 may be fixed may be moved into the chamber 101 by the first conveyer unit 410. The first conveyer unit 410 may be provided to pass through the chamber 101. A substrate 2 may be moved relative to the deposition assembly 100-1. The substrate 2 may be moved by the first conveyer unit 410. A deposition assembly (e.g. 100-1) and the substrate 2 may be spaced from each other by a certain distance that may be kept constant. The deposition material 115 may be discharged from the deposition assembly. The deposition material 115 may be deposited on the substrate 2 to form a layer. The moving unit 430 may be separated from the substrate 2 and the substrate may be returned by a second conveyer unit 420. The second conveyer unit 420 may be provided to pass through the chamber 101, so that the moving unit 430 may be cyclically moved by the first conveyer unit 410 and the second conveyer unit 420.

A deposition assembly may have the same configuration as the deposition assembly included in the deposition apparatuses according to the above-described exemplary embodiments. The formation of the layer may include the operations of acquiring the data associated with the amount of the deposition material 115 discharged from one or more deposition assemblies (e.g. 100-1) per unit time by using the discharge data acquisition unit 600. The discharge data acquisition unit 600 may be disposed on the moving unit 430. The discharge data acquisition unit 600 may transmit data acquired by the discharge data acquisition unit 600 by using the transmission unit 610, while the layer is being formed by depositing the deposition material 115 discharged from the one or more deposition assemblies on the substrate 2. The data may be transmitted wirelessly. The formation of the layer may further include the operation of receiving the data transmitted by the transmission unit 610 by using the reception unit 620.

The formation of the layer may include the operation of converting the data received by the reception unit 620 into data about the thickness of the layer, as illustrated in FIG. 5.

According to this method, when the layer is formed on the substrate 2, the thickness of the layer may be measured in real time. The formation of the layer and the measurement of the thickness of the layer may be conducted substantially simultaneously.

Figure 9:
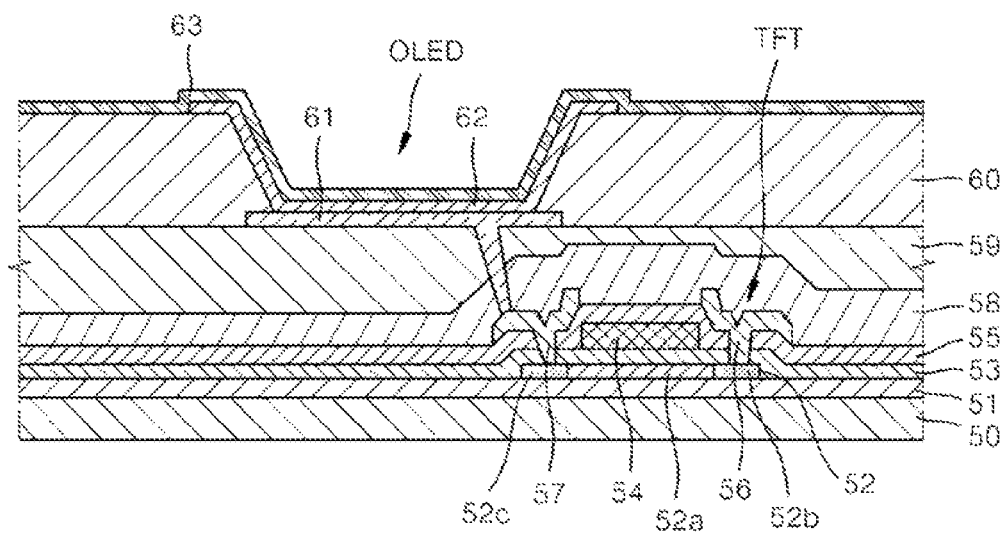
FIG. 9 is a cross-sectional view of an organic light-emitting display device manufactured using the deposition apparatus of FIG. 1 or the like, according to exemplary embodiments of the present inventive concept.

FIG. 9 is a cross-sectional view of an organic light-emitting display device manufactured using the deposition apparatus of FIG. 1 or the like, according to exemplary embodiments of the present inventive concept.

Referring to FIG. 9, the components of the organic light-emitting display device may be formed on a substrate 50. The substrate 50 may be the substrate 2, described above (e.g. FIG. 3), or a part of the substrate 2. The substrate 50 may be formed of a transparent material, for example, glass, plastic, or metal.

A buffer layer 51, a gate insulation layer 53, and an interlayer insulation layer 55, may be formed on a surface of the substrate 50, including over an entire surface of the substrate 50. A patterned semiconductor layer 52 including a channel region 52a, a source contact region 52b, and a drain contact region 52c may be formed, and a gate electrode 54, a source electrode 56, and a drain electrode 57 of a thin film transistor (TFT) may be formed together with the patterned semiconductor layer 52.

A passivation layer 58 covering the TFT, and a planarization layer 59 located on the passivation layer 58 and having a top surface may be formed on the substrate. The top surface of passivation layer 58 may be nearly flat. Layers 58, TFT and layer 59 may be formed on the entire surface of the substrate 50. An organic light emitting diode (OLED) including a patterned pixel electrode 61, an opposite electrode 63 covering almost the entire surface of the substrate 50, and a multi-layered intermediate layer 62 interposed between the patterned pixel electrode 61 and the opposite electrode 63 and including an emission layer may be formed on the planarization layer 59. Some of the multiple layers of the intermediate layer 62 may be common layers that cover almost the entire surface of the substrate 50, and the other layers may be pattern layers patterned to cover the patterned pixel electrode 61. The patterned pixel electrode 61 may be electrically connected to the TFT by a via hole. A pixel-defining layer 60 that covers an edge of the patterned pixel electrode 61 and includes an opening for defining each pixel region may be formed on the planarization layer 59 and may cover almost the entire surface of the substrate 50.

At least some of the components of such an organic light-emitting display device may be formed using the deposition apparatuses according to the aforementioned embodiments.

The intermediate layer 62 may be formed using the deposition apparatuses according to the aforementioned exemplary embodiments of the present inventive concept. A hole injection layer (HIL), a hole transport layer (HTL), an emission layer (EML), an electron transport layer (ETL), and an electron injection layer (EIL), which may be included in the intermediately layer 62, may be formed using the deposition apparatuses according to the aforementioned embodiments.

Deposition of each layer of intermediate layer 62 may be performed while a deposition assembly having a deposition source, a deposition nozzle unit, and a patterning slit sheet, or a substrate on which deposition is to be performed (e.g. a substrate on which up to the pixel electrode 61 is formed), is being moved relative to the other with the deposition assembly separated from the substrate by a certain distance, which may be kept constant.

The intermediate layer 62 can be accurately formed in an organic light-emitting display device having a substrate with a size of, for example, 40 inches or greater.

According to exemplary embodiments of the present inventive concept, deposition apparatuses capable of checking in real time the thickness or uniformity of a thin layer which is formed, methods of manufacturing organic light-emitting display devices by using the deposition apparatuses, and organic light-emitting display devices manufactured using the methods may be provided. The scope of the present inventive concept is not restricted to the exemplary embodiments described herein.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:

1. A deposition apparatus comprising:
   a moving unit to which a substrate is detachably fixed;
   a conveyer unit comprising a first conveyer unit and a second conveyer unit, each of which is configured to move the moving unit, wherein the first conveyer unit is configured to convey, in a first direction, the moving unit, and the second conveyer unit is configured to convey the moving unit in an opposite direction to the first direction;
   a deposition unit comprising a chamber and at least one deposition assembly, the at least one deposition assembly separated from the substrate by a predetermined distance and configured to deposit a deposition material on the substrate;
   a discharge data acquisition unit configured to acquire discharge data associated with an amount of the deposition material discharged per unit time from the at least one deposition assembly; and
   a transmission unit configured to transmit the discharge data acquired by the discharge data acquisition unit.

2. The deposition apparatus of claim 1, further comprising a reception unit configured to receive the data transmitted by the transmission unit.

3. The deposition apparatus of claim 2, wherein the reception unit is disposed within a chamber.

4. The deposition apparatus of claim 2, further comprising a data conversion unit configured to convert the data received by the reception unit into data pertaining to a thickness of a film formed by the deposition unit.

5. The deposition apparatus of claim 1, wherein the deposition assembly comprises:
   a deposition source configured to discharge the deposition material;
   a deposition source nozzle unit comprising one or more deposition source nozzles, the deposition source nozzles being disposed on a side of the deposition source that faces the first conveyer unit; and
   a patterning slit sheet disposed opposite to the deposition source nozzle unit and comprising a plurality of patterning slits arranged in the first direction.

6. The deposition apparatus of claim 1, wherein the discharge data associated with the amount of the deposition material discharged per unit time from the at least one deposition assembly is acquired in real time.

7. The deposition apparatus of claim 1, wherein the discharge data acquisition unit is disposed on at least one edge of the moving unit.

8. The deposition apparatus of claim 7, further comprising at least two discharge data acquisition units.

9. A method of manufacturing an organic light-emitting display device, the method comprising:
   conveying a moving unit into a chamber when a substrate is fixed to the moving unit, wherein the conveying is performed by a first conveyer unit;
   forming a layer by depositing on the substrate a deposition material discharged from one or more deposition assemblies disposed within the chamber while the substrate is moved relative to the deposition assembly by the first conveyer unit, wherein the one or more deposition assemblies are separated from the substrate by a predetermined distance; and returning the moving unit separated from the substrate, wherein the returning is performed by a second conveyer unit provided to pass through the chamber, wherein the forming of the layer comprises:

acquiring data associated with the amount of the deposition material discharged per unit time from the deposition assembly, wherein the acquiring is performed by a discharge data acquisition unit; and transmitting the data acquired by the discharge data acquisition unit, wherein the transmitting is performed by a transmission unit.

10. The method of claim 9, further comprising receiving the data from the transmission unit, wherein the receiving is performed by a reception unit.

11. The method of claim 10, further comprising converting the data received by the reception unit into data about a thickness of the layer formed by the deposition unit.

12. The method of claim 10, wherein the deposition assembly comprises:

a deposition source discharging the deposition material;

a deposition source nozzle unit that comprises a deposition source nozzle and is disposed on a side of the deposition source that faces the first conveyer unit; and a patterning slit sheet that is disposed opposite to the deposition source nozzle unit and comprises a plurality of patterning slits arranged in a first direction.

13. The method of claim 9, wherein the data associated with the amount of the deposition material discharged per unit time from the deposition assembly is acquired in real time and the forming of the layer is performed substantially simultaneously with acquisition of the data.

14. The method of claim 9, wherein the discharge data acquisition unit is attached to at least one edge of the moving unit.

15. The method of claim 14, wherein the discharge data acquisition unit comprises at least two sensors.

* * * * *